United States Patent

Siegle

[11] Patent Number: 5,507,021
[45] Date of Patent: Apr. 9, 1996

[54] METHOD TO INPUT ALPHANUMERICAL INFORMATION INTO A DEVICE HAVING A CENTRAL COMPUTER, A MEMORY, AND A KEYPAD

[75] Inventor: Gert Siegle, Berlin, Germany

[73] Assignee: Robert Bosch GmbH, Stuttgart, Germany

[21] Appl. No.: 137,154

[22] PCT Filed: Feb. 16, 1993

[86] PCT No.: PCT/DE93/00131

§ 371 Date: Oct. 21, 1993

§ 102(e) Date: Oct. 21, 1993

[87] PCT Pub. No.: WO93/17496

PCT Pub. Date: Sep. 2, 1993

[30] Foreign Application Priority Data

Feb. 21, 1992 [DE] Germany .......................... 42 05 338.2
Sep. 16, 1992 [DE] Germany .......................... 42 30 912.3

[51] Int. Cl.[6] .................................................. H04B 1/18
[52] U.S. Cl. ............................... 455/158.4; 455/158.5; 455/186.2; 455/183.2
[58] Field of Search ........................... 455/186.1, 186.2, 455/185.1, 158.4, 183.2, 158.5, 34.1, 54.2; 379/88; 345/168

[56] References Cited

U.S. PATENT DOCUMENTS

| 5,001,775 | 3/1991 | Hayashi et al. ................. 455/158.5 |
| 5,020,143 | 4/1991 | Duckeck et al. ................ 455/186.1 |
| 5,045,947 | 9/1991 | Beevy ......................... 455/158.5 X |
| 5,152,011 | 9/1992 | Schwob ........................ 455/158.5 |
| 5,184,971 | 2/1993 | Williams ....................... 379/88 X |
| 5,187,810 | 2/1993 | Yoneyama et al. .............. 455/34.1 |

FOREIGN PATENT DOCUMENTS

| 0359476 | 3/1990 | European Pat. Off. . |
| 0401015 | 12/1990 | European Pat. Off. . |
| 2083722 | 3/1982 | United Kingdom . |

Primary Examiner—Edward F. Urban
Assistant Examiner—Philip J. Sobutka
Attorney, Agent, or Firm—Kenyon & Kenyon

[57] ABSTRACT

A method is proposed for entering alphanumeric information in an electronic apparatus, in which the entry is effected via an ordinary numerical keyboard. Based on the numbers entered, in which connection not more than three letters are associated with each number, corresponding letter-number combinations are sought in a memory and the information found is displayed. By means of the invention, it is possible also to enter alphanumeric information into an apparatus by means of a numerical keyboard.

3 Claims, 6 Drawing Sheets

| | | | | | |
|---|---|---|---|---|---|
| BR 1 | 16 * 1 | | SDR 1 | 726 * 1 | |
| BR 2 | 16 * 2 | | | | |
| BR 3 | 16 * 3 | | SFB 1 | 721 * 1 | |
| NDR 1 | 526 * 1 | | | | |
| NDR 2 | 526 * 2 | | SR 1 | 76 * 1 | |
| LNB | 451 | | | | |
| LOC | 451 | | | | |
| LMB | 451 | | | | |
| LNC | 451 | | | | |

| | | |
|---|---|---|
| Stuttgart | 7000 | A |
| Leonberg | 7250 | A |
| München | 8000 | B |
| ⋮ | ⋮ | ⋮ |

FIG. 8

| Stuttgart | 77777 3167 |
| Aich | 1 3 1 3 |
| Bich | 1 3 1 3 |

| A B C | D E F ↑ | G H I |
| :---: | :---: | :---: |
| 1 | 2 | 3 |
| J K L | M N O | P Q R |
| 4 | 5 | 6 |
| S T U | V W ↓ | X Y Z |
| 7 | 8 | 9 |
| T M C | Ä Ö Ü | |
| * | 0 | # |

Fig. 9

METHOD TO INPUT ALPHANUMERICAL INFORMATION INTO A DEVICE HAVING A CENTRAL COMPUTER, A MEMORY, AND A KEYPAD

BACKGROUND OF THE INVENTION

The present invention is related to a method for the input of alphanumeric data into an electronic machine having an operating computer with a memory and a keyboard with keys, some or all of which having more than one letter of the alphabet associated with them.

For the input of alphanumeric data into an electronic machine, it is already known, for instance in the case of computers, to use a typewriter keyboard by which both letters and numerals can be entered. However, a typewriter keyboard, takes up a relatively large amount of space, particularly when only a few entries or else only brief entries are necessary. Furthermore, it is already known to convert letter information into code numbers which are contained in code lists. In this case, numbers are assigned to given words and then typed in by the operator of the machine via a number keyboard. This type of input, however, requires the operator of the machine to have the code table by him at the time of the entry. However, on many occasions, this is not the case and furthermore there is the danger of the operator misreading the table so that erroneous entries are effected. Furthermore, it has already been proposed to pass through the alphabet by means of direction keys and thus select the correct letters and then confirm them by pressing an enter key. This method also requires increased attention on the part of the operator since he must stop the search at the proper place and then confirm the letter desired. This type of entry is not advantageous in particular when the user of the electric machine has his attention diverted by other matters, or his attention must be directed to other things, for instance in highway traffic.

SUMMARY OF THE INVENTION

The method of the present invention is implemented by a device having an operating computer with a memory and has the advantage over the known devices in that the electronic apparatus is equipped with a simple, commercially available numerical keyboard and nevertheless alphanumeric entries are possible without this requiring great attention on the part of the operator. Apparatus developed in this manner are, on the one hand, relatively handy and, on the other hand, a type of entry which is understood by the operator without his having to convert the instruction which he would like to give the apparatus into a machine language which is incomprehensible to him. It is advantageous if the information given to the apparatus is not only displayed but, in addition, the appropriate command is also carried out at the same time in the apparatus if such information is unambiguous. In this way, the work of the operator is greatly facilitated. It is furthermore advantageous that, in the event of ambiguities, the operator be shown a selection menu of candidate selections so that he can eliminate any lack of clarity which is present merely by depressing another key. Finally, it is also advantageous to mark the ambiguity of the information entered by means of special characters, particularly by arrows in the display. In addition to the purely numerical keys, it is advantageous to provide one or two special keys by which the operating sequences can be differentiated or concluded. In this way, it is possible to also enter spacing information or to mark the end of the entry. The method of the present invention is of particularly advantageous use where the attention of the operator is claimed to a greater extent by other events. This is particularly true in the case of radio receivers which are present in vehicles. A particularly simple input device is also required in the case of navigation instruments in the car, or in the case of telephones, particularly mobile telephones.

The entry keyboard can most easily be formed as a known numeric key pad. Numeric key pads are manufactured in large numbers for telephones at a rather low cost so that the device equipped therewith is not made more expensive, or only insignificantly so. As special keys there enter into this connection, in particular, those keys of the telephone key pad which are not provided with numbers, particularly the asterisk key and the pound key. It is furthermore advantageous to provide a speaker if the attention of the driver is not to be diverted by glancing at an optical display. In this way, it is possible for the driver to immediately to recognize whether he has given the correct instruction or whether several instructions are to be carried out due to ambiguities. It is particularly advantageous to load the alphanumeric entry by a smart card, an external memory, or an external computer, since, in this way, larger amounts of data or fixed data sequences can be automatically loaded. The advantages of remote data transmission and of the networking of systems can be utilized.

The present invention can be advantageously employed in combination with a radio receiver, it being possible for the operator of the radio receiver to enter in clear text the station which he desires to receive. The operator can therefore enter the desired station directly into the receiver, for instance the Second Program of North German Radio (NDR 2), the receiver automatically tuning to the corresponding station. The the station can be set in this connection either by a reference table which is stored in the receiver and associates the names of the stations with the station frequencies, or else by comparison of the code entered with the code transmitted by the station or the code transmission taking place, for instance, via the known RDS system. If an ambiguity of the input results in this connection, it is advantageous to display the possible stations and make a selection by means of the keyboard. In accordance with the present invention, the receiver notes the selection which has once been made and, upon the next calling up of this entry sequence will immediately use the selection last selected.

The use of area codes for the entry of the present position and direction is particularly advantageous since they are generally known and easy to handle. The selection of the news in the case of RDS-TMC receivers can be effected precisely with the use of the area codes, without the driver having to have any special knowledge or having to learn a complicated input procedure.

BRIEF DESCRIPTION OF THE DRAWING

Embodiments of the present invention are shown in the drawing and are explained in the following detailed description.

FIG. 2 illustrates the contents of a memory in the radio receiver;

FIG. 8 is a table for associating the area code with the geographical longitude and latitude of the localities, and FIG. 9 is an illustration of a number key pad.

DETAILED DESCRIPTION OF THE EMBODIMENTS

Figure 1:
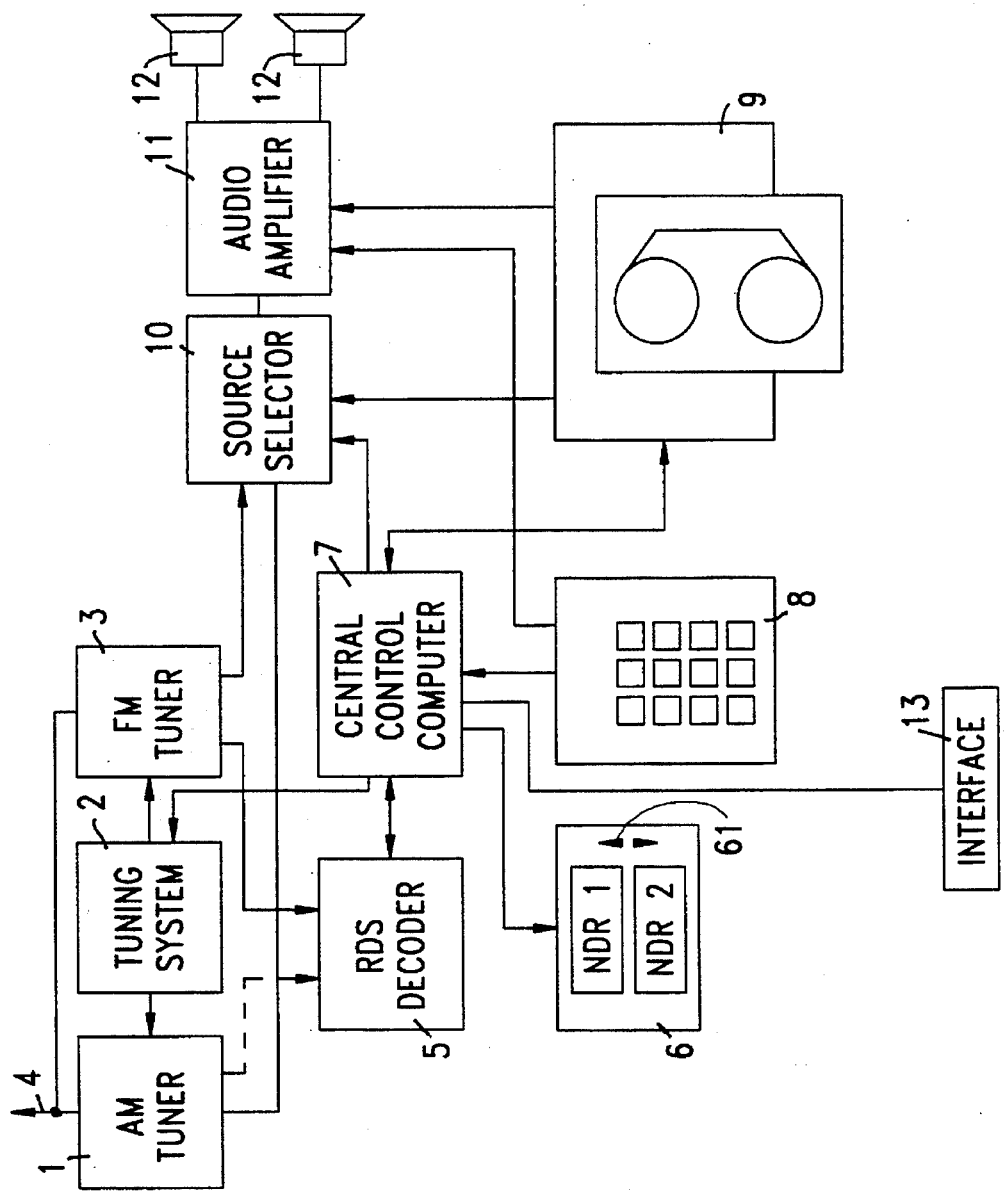
FIG. 1 is a block diagram of a radio receiver as an electronic instrument having an operating keyboard.

FIG. 1 shows a radio receiver which, in this case, has a known AM tuner 1 and an FM tuner 3, also known per se. The tuners 1 and 3 are together connected to an antenna 4 which can be connected to the radio receiver. There is furthermore provided a tuning system 2 by which the receiving frequency of the AM or FM tuner can be set. The radio receiver furthermore has a known RDS decoder 5, with which it is possible to receive and interpret information which is digitally transmitted together with the radio transmission. The RDS decoder 5 receives the station names for instance as ASCH characters, as well as the frequencies on which the corresponding program can also be heard. Furthermore, information with respect to traffic conditions can also be interpreted in the RDS coder 5. The information received and decoded by the RDS decoder 5 passes to the central control computer 7, this control computer 7 consisting of a computer and memories. The memories contain, in part, programs for the operation of the instrument as well as further information, as will be explained further below. In the example shown, the computer 7 is connected to the tuning system 2 for the tuning of the corresponding reception frequency, and to a source selector 10 for selecting the data source. Furthermore, the computer 7 exchanges data and information with the RDS decoder 5. The computer 7 furthermore operates a display 6, in order to display there the stations received or entered. Finally, the computer 7 is also connected with a numerical keyboard 8 which makes it possible to enter information. For the exchange of data with a smart card, an external memory or an external computer, the computer 7 is provided with an interface 13. In the example shown, the selection of the source also takes place via the computer, so that either the signal of the FM tuner, of the AM tuner or of another device 9 which is present can be sent to the audio amplifier 11. The further device 9 can be, for instance, a cassette player or compact-disk player, in which connection these players may also be connected to the memory. Thus, by means of an interposed CD, it is possible to send data into the memories of the computer 7 or else call up data from the additional device 9. Finally, two loudspeakers 12 are connected to the audio amplifier, making it possible to hear the program received.

Figure 3:
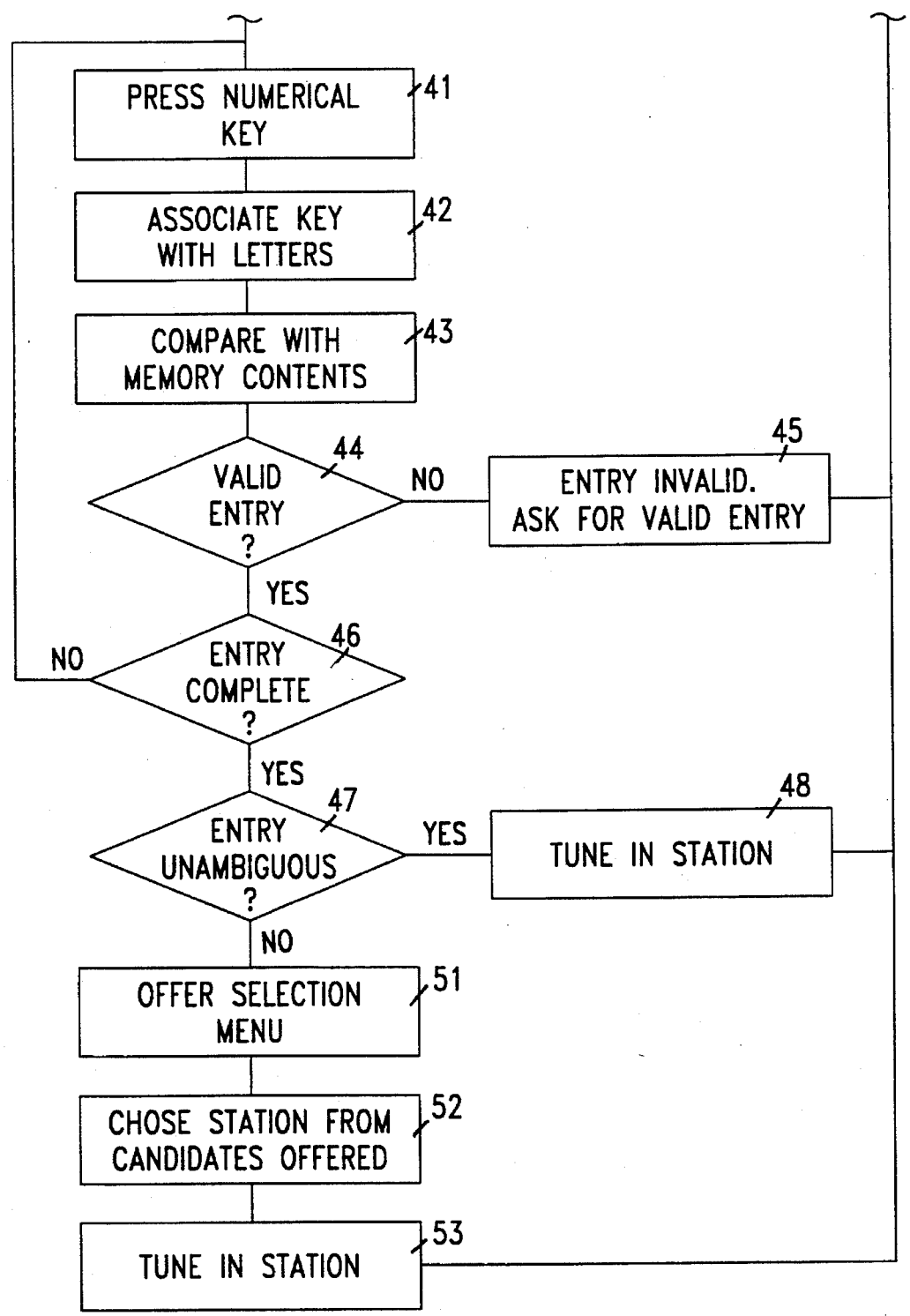
FIG. 3 is a flow diagram concerning the operation of the control computer with regard to the information entered.

The manner of operation of the device will be explained in further detail with reference to FIGS. 2 and 3. FIG. 2 illustrates the content of a data memory such as contained, for instance, in the radio receiver, while FIG. 3, as structure diagram, illustrates the flow of the program which is run by the computer 7 with respect to the input. The keyboard 8 is developed as an ordinary telephone keyboard. In this case, the keys 1, 2 and 3 are present in the top row, in the next row the keys 4, 5 and 6, in the second row from the bottom the keys 7, 8 and 9, and in the bottom row the keys *, 0 and #. The letters A, B and C are at the same time assigned to the key 1, the letters D, E, F to the key 2, the letters G, H, I to the key 3, the letters J, K, L to the key 4, the letters M, N, O to the key 5, the letters P, Q, R to the key 6, the letters S, T, U to the key 7, the letters V, W to the key 8, the letters X, Y, Z to the key 9, and the letters Ä, Ö, Ü to the key 0. Other assignments are possible and provided for. On basis of this arrangement of letters, it is now possible to type into the keyboard directly, in clear text, the stations which it is desired to listen to. These stations are contained in the memory 71 in the computer 7 of the radio receiver or, after the turning on of the device, are transmitted from a data support 8 into the working memory of the computer 7, as shown, for instance, in FIG. 2. Abbreviations customary in Germany are, for instance, BR for Bavarian Radio, NDR for North German Radio, SDR for South German Radio, SFB for Free Berlin and SR for Saarland Radio. The abbreviations LMD, LOC, LNB and LNC characterize for instance other radio stations.

The numbers corresponding to the stations designate the different programs which are broadcast by the individual stations. Thus, in Germany, the broadcasting stations customarily broadcast three of more programs which are characterized by the numbers appearing next to them. The corresponding numerical keys which are to be depressed by the operator are associated with the programs. Therefore, if the operator of the auto radio desires to receive Bavarian Radio, station, he first depresses the key 1 since the letters A, B and C are associated with it, and then the key 6 since the letters P, Q and R are associated with it. If he desires to receive the third program of the Bavarian radio station, he then presses the space key, which in the embodiment shown bears an asterisk. He then presses the 3 for the third program, so that the key sequence 1, 6, *, 3 is to be entered by the operator. After he has confirmed this entry, for instance by depressing the pound key, the microprocessor 7 now checks the table shown in FIG. 2 and notes that for the keyboard input 1, 6 * 3, only one possibility is present, namely the reception of BR 3. This program is now shown in the display 6 and is tuned in by means of the tuning system 2 so that the operator of the instrument now receives radio station BR3. As an alternative, the use of the space key can be omitted so that the sequence of numbers in the above example is 1, 6, 3.

This may be explained in further detail with reference to the structure diagram of FIG. 3. First of all, a numerical key is pressed by the operator at step 41 which key may at the same time represent letters. At step 42, the key is now associated with all possible letters. This means that in addition to the number 1, the letters A, B, C are associated with the key 1, the letters G, E, F with the key 2, and so on. Thereupon, at 43, a comparison is made with the memory contained in the unit—in the case of a radio receiver the memory 71. At step 44 it is now checked whether such a combination is present, and therefore whether there has been a valid entry. If, in the example given, the operator of the device meant, for instance, to enter the letter G and for this depressed the third key, then it would be noted, on basis of the memory 71, that no such entry is provided for. Therefore, at step 45 this combination would be rejected as invalid and the operator called upon to enter a valid combination. If, for instance, the operator had depressed the 1 key, then it would be noted at the place 44 that for the 1 key as first input only one alternative is possible, namely "B". At step 46, it is now checked whether the entry has been completed. If not, the steps 41, 42, 43 and 44 are repeated so that therefore a new input is waited for, and a verification of the combination is again effected, checking for valid or invalid entries. If, for example, the 5 key is depressed as second entry, this entry also would be rejected as invalid at the place 44, since a combination of the keys 1, 5 is not provided in the memory 71, as shown in FIG. 2. In the embodiment shown, only the combination of keys 1, 6 would be permissible. If, the entry is stopped after the entering of the first and sixth keys at step 46, for instance by the depressing of the pound key, then the program jumps to step 47 and checks whether this entry is unambiguous. In the example assumed above, this, however, is not the case. The entry would only have been unambiguous if the operator had, for instance, in addition also entered *3, since then an unambiguous association with radio station Bavaria 3 would have been possible. The program then would have switched to step 48 and tuned in radio station Bavaria 3 in the manner described below.

Since, however, in the example, the desire for the third program was not expressed, the statement is ambiguous in accordance with the memory content in the memory 71, since either the first, second or third program could be intened. The program, therefore, switches to the step 51 and now offers a selection menu in which the operator is asked whether he wishes to hear the first, second or third program. By depressing the keys 12 3 of the inquiry step 52, it is possible now to enter the missing information so that the corresponding radio station is tuned in at step 53. If the values entered at step 45 have been rejected as invalid, or if a tuning-in has not taken place, either due to the ambiguity of the results at the step 48 or due to the selection at step 53, the program will be exited and the microcomputer will accept further instructions.

While in the example just given, the selection menu was called up due to an incomplete entry, it may also happen that the selection menu is brought up due to ambiguities in the information. If, for instance, the operator wishes to enter Station LOC, he must depress the key sequence 4, 5, 1 in accordance with the agreement made. In addition to Station LOC, he would, however, also have to press this key combination if he wishes to receive Station LMB, LNC or LNB. It is now not possible by means of the computer of the radio receiver to decide which station the operator actually would like to listen to. In this case also, despite a correct and complete entry, switching is effected to step 51, in which connection the operator is now offered Stations LMB, LOC, LNB and LNC for selection. By operating the corresponding selection key (↑,↓) it is now possible to select Station LOC. The selection keys (↑,↓) are preferably located on the keys which bear the numbers 2 and 8 respectively, or else on separate special keys (see FIG. 9).

As is readily evident, the entry by means of the input keyboard is less likely to be ambiguous the longer the word is which describes the command. If, for instance, the words "North German Radio" were entered completely, confusion with other words is scarcely possible since, due to the large number of key values entered, an unequivocal association is generally possible. Ambiguities occur, however, in the case of relatively short words, such as, for instance, station abbreviations, as shown by the example LMB, LOC. Ambiguities can also not be avoided if they are desired by the operation, for instance if, by an incomplete entry, the operator would like to be offered a selection, for instance when the operator doesn't know how many different programs are broadcast by a given radio station.

Figures 4, 5, 6:
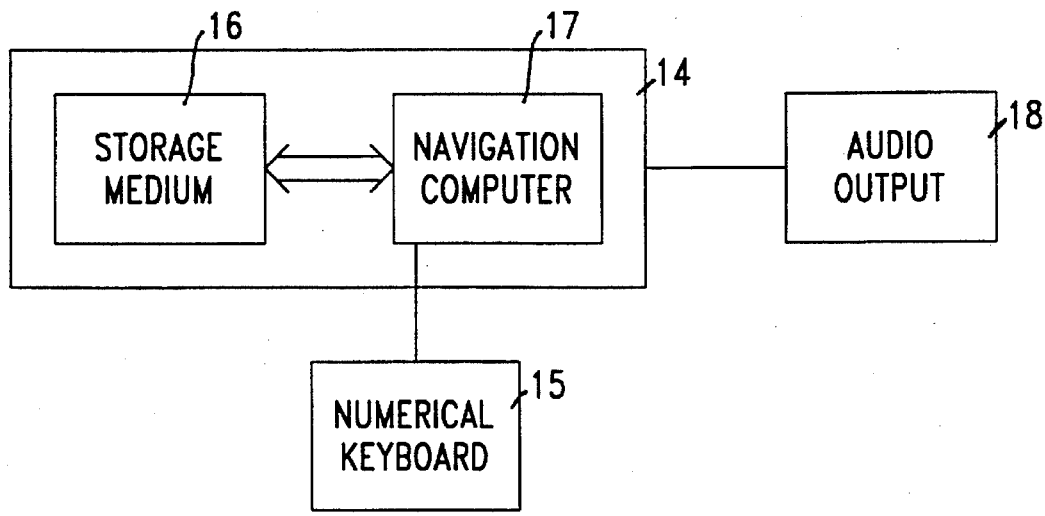
FIG. 4 illustrates the contents of a memory for the associating of frequencies with the stations entered.
FIG. 5 is a block diagram of a navigation device having an input keyboard.
FIG. 6 illustrates the contents of a memory in the navigation device.

If the operator has now expressed the wish to listen, for instance, to Bavaria 1 (BR1), the computer 7 looks in the memory 72 associated with it which is shown in FIG. 4 and finds there that the station Bavaria 1 can be heard on frequencies 98.4, 96.6 and 83.5 megahertz. The computer 7 now causes the tuning system 2 and the FM tuner 3 to tune to these frequencies and to determine where the best signal is to be received. This frequency is selected and the listener can now hear the program of Bavaria 1. At the same time, this station is indicated as sole station on the display 6.

The display 6 in FIG. 1 furthermore shows the case that the operation has pushed keys 5, 2 and 6. In this case, the symbol 61 appears, which indicates that a selection must be made while, at the same time, two of the selection possibilities are shown in the display 6. As an alternative, it would furthermore be possible to provide an acoustic indication rather than a visual one, in the manner, for instance, that the information as to the further procedure is given over the loudspeakers 12 of the radio receiver. It may be pointed out that the memory 71 of FIG. 2 contains only a small portion of the inputs which it is possible to store. In addition to the names of the stations in abbreviated text, they could also be entered in full text, and further information could be entered with regard to the selection of the program to be heard, for instance, music, news, or the like.

If very lengthy information is to be called up, it may easily happen that the capacity of the memory becomes so great that it is not advisable to hold it available in a fixed storage in the microprocessor 7. In this case, it is also possible to use the cassette player or CD player 9 of the radio receiver as storage means in which relatively lengthy data are to be stored. This type of data storage also facilitates replacement by updated data, for instance in the event of a change in the name of stations (Central German Radio), or upon a change in the frequencies of the radio stations which are stored in the memory 72 in FIG. 4.

FIG. 5 shows another embodiment in connection with the present invention. In this case, a known navigation system 14 is shown, having a navigation computer 17 as well as a storage medium 16 which, in digitalized form, contains a map as well as locality data. The numerical keyboard 15 and an audio output 18 are also shown. By means of the numerical keyboard 15, the final destination of a trip or the instantaneous location can be entered in the manner described above. In order to enter "Stuttgart", the keys 777773167 are to be depressed and the end of the entry confirmed by the pound key. Here, also, ambiguities are possible, for instance if the traveler wants to enter Aich as destination and enters the digit sequence 1313. This could also stand for the town of Bich, so that the decision must be made by means of a selection menu. The same would be true if, for instance, the traveler were to enter "Kirchheim", since Kirchheim is a very common name in Germany and therefore ambiguities cannot be avoided.

Streets can also be entered in the same manner as towns. For example, it is possible to enter, for instance, "Haupstrasse 50" by depressing the keys 3176777*50. It is therefore possible, by means of the numerical keyboard, also to indicate lengthy words without requiring a large alphanumeric keyboard. The essential thing here is that a storage be present in which the possible combinations are indicated so that, on basis of an entry a conversion into machine-readable numbers is possible and, at the same time, the unequivocal character of the entry is assured.

FIG. 6 shows, for instance, an example illustrating contents of the storage medium 16 as used in combination with a navigation instrument. Due to the relatively large amount of data necessary here, and which may also easily change, the use of a CD-ROM as storage means is advisable.

The entry of alphanumeric data is not limited to this example. In combination with radio receivers, it is possible also to include a memory in accordance with FIG. 6 in addition to the memories 71 and 72 in the radio receiver. In this way, it becomes possible to effect the entry of given towns or regions in order, for instance, to permit traffic reports in accordance with the TMC system only for such localities or region as have been entered. In this way, the number of traffic reports received can be reduced.

Figure 7:
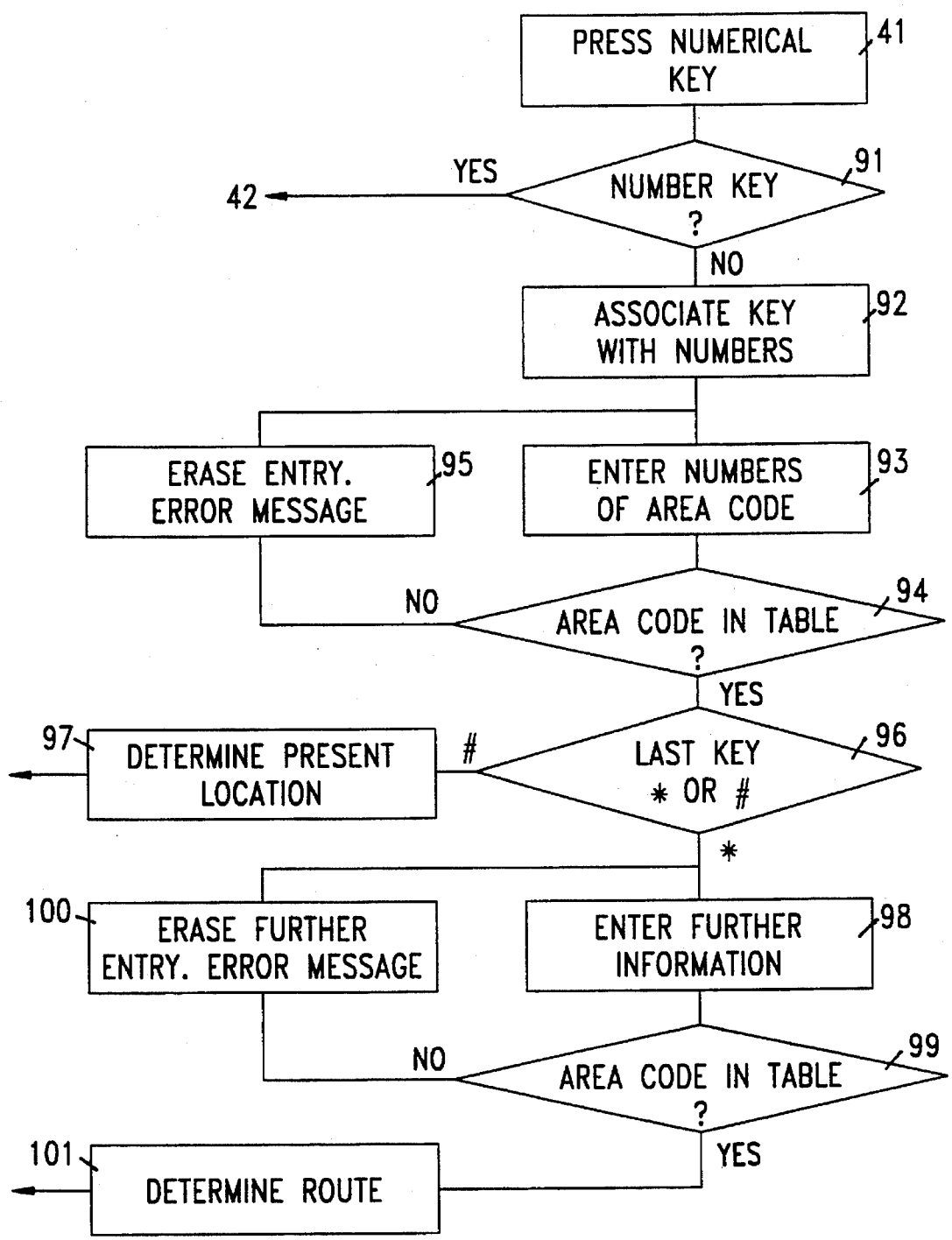
FIG. 7 is a flow diagram for the use of the area codes for the indication of the existing location and direction.

Another development of the present invention consists in establishing a determination of present location and an indication of direction by the entry of area codes. The procedure for this method will be described on the basis of the structure diagram shown in FIG. 7. After the actuating of a key at step 41 (see FIG. 3), a checking of the first value entered takes place at step 91. If a numerical value is concerned, then reference is had to program at step 92 and the procedure is that explained on the basis of FIG. 3. If a special key has been depressed, then the corresponding numbers which are indicated on the keys are associated, in any event, with the keys at point 92. At step 93, further numbers which constitute an area code are entered, the entry being concluded with the asterisk or pound key. If the operator wishes to enter the place where he is, the entry is concluded with the pound key. If the operator, in addition to the place where he is, would like at the same time to enter a direction, then the asterisk key is used as final key. At step 94, the combination of numbers is compared with the area codes contained in table 80. Table 80 is shown in FIG. 8. If the combination of numbers entered is not contained in the table, then the combination of numbers entered is erased by the operating computer at step 95, an error message is given by the display device, and the program jumps back to step 93. The entry must be effected again. If the combination of numbers entered corresponds to with a combination present in the table, a verification is effected at step 96 as to whether the entry of the numbers was concluded with the asterisk key or with the pound key. If concluded with the pound key, switching is effected to program step 97. There, the computer determines the present location by means of the data indicated in the table. With the indication of the present position, it is possible to display traffic information at the place of present location. After this, switching is effected to another program. If the entry of the combination of numbers at step 93 was concluded with the asterisk key, in other words the operator would like to enter a direction, then the computer waits for the entry of further information at step 98. The operator enters the numbers by the keys and concludes the entry with the special "pound" key. At step 99, the second information entered is also compared with the area codes contained in table 80. If the combination of numbers entered is not contained in the table, then, at program step 100, an error message is given off by the operating computer by means of a display device and reference is had back to step 98, so that the entry of the second locality must be effected again. If the combination of numbers entered is contained in the table, then the computer determines, at program step 101, the place of location and the route which leads from the first place entered to the second place entered. It is now possible, for instance, to display traffic information specifically for a given direction of travel. After step 101, switching is effected to a further program 41.

FIG. 9 diagrammatically shows a number key pad. The keys are provided in accordance with the present invention with numbers, special symbols, and letters. In this example, three letters are associated with each number key and with the asterisk key. The number keys 2 and 8 are furthermore provided with the special symbols "arrows" (↑,↓). If, for instance, several stations are offered for selection, the station is determined by means of the "arrow" special keys.

I claim:

1. A radio receiver comprising:

a) a tuner;

b) a display;

c) a processor;

d) a memory coupled with said processor and storing numerical sequences corresponding to radio stations;

e) a keypad having numerical keys, each key having at least one letter of the alphabet associated therewith;

f) means for facilitating data communication between said receiver and said processor, between said display and said processor, and between said keypad and said processor, wherein after a numerical sequence is input via said keypad which matches a numerical sequence stored in said memory, the corresponding radio station is tuned in by said tuner, wherein said memory further stores a locality associated with at least one of a ZIP code, a geographical latitude and longitude, and registration numbers of automotive vehicles, wherein said processor is able to determine at least one of a present location of the radio receiver or destination of the radio receiver based on at least one of a ZIP code or a registration number entered via said keypad, and further comprising a display coupled with said processor and adapted to display travel routes, directions, and distances computed by said processor based on two entries of at least one of ZIP code, a geographical latitude and longitude, or vehicle registration number via said keypad.

2. The radio receiver of claim 1 wherein said numerical sequence stored in said memory corresponds to at least one of a station identification, a station frequency, and a station name.

3. The radio receiver of claim 1 further comprising an RDS decoder wherein said stations stored in said memory correspond to stations decoded by said RDS decoder.

* * * * *